US010090317B2

(12) United States Patent
Sun et al.

(10) Patent No.: US 10,090,317 B2
(45) Date of Patent: Oct. 2, 2018

(54) METHODS AND APPARATUSES HAVING MEMORY CELLS INCLUDING A MONOLITHIC SEMICONDUCTOR CHANNEL

(71) Applicant: Micron Technology, Inc., Boise, ID (US)

(72) Inventors: Jie Sun, Boise, ID (US); Zhenyu Lu, Boise, ID (US); Roger W. Lindsay, Boise, ID (US); Brian Cleereman, Boise, ID (US); John Hopkins, Meridian, ID (US); Hongbin Zhu, Boise, ID (US); Fatma Arzum Simsek-Ege, Boise, ID (US); Prasanna Srinivasan, Boise, ID (US); Purnima Narayanan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/221,131

(22) Filed: Jul. 27, 2016

(65) Prior Publication Data

US 2016/0336341 A1 Nov. 17, 2016

Related U.S. Application Data

(62) Division of application No. 14/069,574, filed on Nov. 1, 2013, now Pat. No. 9,431,410.

(51) Int. Cl.
*H01L 21/3205* (2006.01)
*H01L 27/11582* (2017.01)
(Continued)

(52) U.S. Cl.
CPC .... *H01L 27/11582* (2013.01); *G11C 16/0483* (2013.01); *H01L 27/1157* (2013.01);
(Continued)

(58) Field of Classification Search
CPC ......... H01L 27/11556; H01L 27/11524; H01L 27/1157; H01L 27/11582; H01L 29/66825; H01L 29/7889; G11C 16/0483
(Continued)

(56) References Cited

U.S. PATENT DOCUMENTS 9,431,410 B2  8/2016  Sun et al.
9,437,604 B2  9/2016  Lu et al.
(Continued)

FOREIGN PATENT DOCUMENTS

CN  105745749 A  7/2016
JP  2006352104 A  12/2006
(Continued)

OTHER PUBLICATIONS

"International Application Serial No. PCT/US2014/063377, International Search Report dated Jan. 23, 2015", 3 pgs.
(Continued)

*Primary Examiner* — Vongsavanh Sengdara
(74) *Attorney, Agent, or Firm* — Schwegman Lundberg & Woessner, P.A.

(57) ABSTRACT

Methods for forming a string of memory cells, apparatuses having a string of memory cells, and systems are disclosed. One such method for forming a string of memory cells forms a source material over a substrate. A capping material may be formed over the source material. A select gate material may be formed over the capping material. A plurality of charge storage structures may be formed over the select gate material in a plurality of alternating levels of control gate and insulator materials. A first opening may be formed through the plurality of alternating levels of control gate and insulator materials, the select gate material, and the capping material. A channel material may be formed along the sidewall of the first opening. The channel material has a
(Continued)

thickness that is less than a width of the first opening, such that a second opening is formed by the semiconductor channel material.

19 Claims, 18 Drawing Sheets

(51) Int. Cl.

| | | |
|---|---|---|
| H01L 27/11556 | (2017.01) | |
| H01L 27/11524 | (2017.01) | |
| H01L 29/66 | (2006.01) | |
| H01L 29/788 | (2006.01) | |
| G11C 16/04 | (2006.01) | |
| H01L 27/1157 | (2017.01) | |

(52) U.S. Cl.
CPC .. *H01L 27/11524* (2013.01); *H01L 27/11556* (2013.01); *H01L 29/66825* (2013.01); *H01L 29/7889* (2013.01)

(58) Field of Classification Search
USPC .................................... 438/588, 258
See application file for complete search history.

(56) References Cited

U.S. PATENT DOCUMENTS

| | | | |
|---|---|---|---|
| 2005/0224346 A1* | 10/2005 | Holm-Kennedy | B82Y 30/00 204/403.01 |
| 2006/0258091 A1 | 11/2006 | Deloach | |
| 2007/0158736 A1* | 7/2007 | Arai | H01L 27/105 257/315 |
| 2008/0067583 A1 | 3/2008 | Kidoh et al. | |
| 2009/0096010 A1 | 4/2009 | Hyun | |
| 2009/0097318 A1 | 4/2009 | Sarin et al. | |
| 2009/0290412 A1 | 11/2009 | Mouli | |
| 2010/0039865 A1 | 2/2010 | Kidoh | |
| 2010/0207193 A1 | 8/2010 | Tanaka et al. | |
| 2010/0295120 A1 | 11/2010 | Sandhu et al. | |
| 2011/0002178 A1 | 1/2011 | Hwang et al. | |
| 2011/0024818 A1* | 2/2011 | Ahn | H01L 21/28273 257/314 |
| 2011/0049608 A1 | 3/2011 | Kidoh et al. | |
| 2011/0073866 A1 | 3/2011 | Kim et al. | |
| 2011/0147823 A1 | 6/2011 | Kuk et al. | |
| 2011/0233646 A1 | 9/2011 | Mizushima et al. | |
| 2011/0248327 A1 | 10/2011 | Son et al. | |
| 2012/0001249 A1 | 1/2012 | Alsmeier et al. | |
| 2012/0068242 A1* | 3/2012 | Shin | H01L 27/11578 257/315 |
| 2012/0077320 A1 | 3/2012 | Shim et al. | |
| 2012/0132981 A1 | 5/2012 | Imamura et al. | |
| 2012/0231593 A1 | 9/2012 | Joo et al. | |
| 2012/0256247 A1 | 10/2012 | Alsmeier | |
| 2013/0049095 A1 | 2/2013 | Whang et al. | |
| 2013/0077380 A1 | 3/2013 | Sakamoto | |
| 2013/0089974 A1 | 4/2013 | Lee et al. | |
| 2013/0248974 A1 | 9/2013 | Alsmeier et al. | |
| 2013/0270625 A1 | 10/2013 | Jang et al. | |
| 2013/0307053 A1 | 11/2013 | Polishchuk et al. | |
| 2014/0167131 A1 | 6/2014 | Lu et al. | |
| 2014/0231954 A1 | 8/2014 | Lue | |
| 2014/0264353 A1 | 9/2014 | Lai | |
| 2014/0334230 A1 | 11/2014 | Kwon, II | |
| 2015/0123188 A1 | 5/2015 | Lu et al. | |
| 2015/0123189 A1 | 5/2015 | Sun et al. | |
| 2016/0372479 A1 | 12/2016 | Lu et al. | |

FOREIGN PATENT DOCUMENTS

| | | |
|---|---|---|
| JP | 2008192708 A | 8/2008 |
| JP | 2009158529 A | 7/2009 |
| JP | 2011023586 A | 2/2011 |
| JP | 2012119445 A | 6/2012 |
| JP | 2013153382 A | 8/2013 |
| JP | 2013201396 A | 10/2013 |
| JP | 2013219239 A | 10/2013 |
| WO | WO-2015066447 A1 | 5/2015 |
| WO | WO-2015066463 A1 | 5/2015 |

OTHER PUBLICATIONS

"International Application Serial No. PCT/US2014/063377, Written Opinion dated Jan. 23, 2015", 6 pgs.
"International Application Serial No. PCT/US2014/063407, International Search Report dated Jan. 29, 2015", 3 pgs.
"International Application Serial No. PCT/US2014/063407, Written Opinion dated Jan. 29, 2015", 10 pgs.
"U.S. Appl. No. 15/255,967, Non Final Office Action dated Jul. 27, 2017", 19 pgs.
"European Application Serial No. 14857452.8, Extended European Search Report dated Jun. 7, 2017", 7 pgs.
"International Application Serial No. PCT/US2014/063377, International Preliminary Report on Patentability dated May 12, 2016", 8 pgs.
"International Application Serial No. PCT/US2014/063407, International Preliminary Report on Patentability dated May 12, 2016", 12 pgs.
"Japanese Application Serial No. 2016-526281, Office Action dated Mar. 28, 2017", w/ English Translation, 10 pgs.
"Japanese Application Serial No. 2016-526281, Response filed Jun. 27, 2017 to Office Action dated Mar. 28, 2017", W/ English Claims, 16 pgs.
"Korean Application Serial No. 10-2016-7014682, Office Action dated Jul. 31, 2017", With English Translation, 16 pgs.
U.S. Appl. No. 14/069,553, filed Nov. 1, 2013, Methods and Apparatuses Having Strings of Memory Cells Including a Metal Source.
U.S. Appl. No. 14/069,574, filed Nov. 1, 2013, Methods and Apparatuses Having Memory Cells Including a Monolithic Semiconductor Channel.
U.S. Appl. No. 14/069,553, Restriction Requirement dated Feb. 10, 2015, 10 pgs.
U.S. Appl. No. 14/069,553, Response filed Apr. 10, 2015 to Restriction Requirement dated Feb. 10, 2015, 6 pgs.
U.S. Appl. No. 14/069,553, Non Final Office Action dated Jul. 13, 2015, 16 pgs.
U.S. Appl. No. 14/069,553, Response filed Aug. 12, 2015 to Non Final Office Action dated Jul. 13, 2015, 8 pgs.
U.S. Appl. No. 14/069,553, Final Office Action dated Oct. 5, 2015, 17 pgs.
U.S. Appl. No. 14/069,553, Response filed Feb. 5, 2016 to Final Office Action dated Oct. 5, 2015, 9 pgs.
U.S. Appl. No. 14/069,553, Advisory Action dated Feb. 22, 2016, 5 pgs.
U.S. Appl. No. 14/069,553, Notice of Allowance dated May 4, 2016, 9 pgs.
U.S. Appl. No. 14/069,574, Restriction Requirement dated Feb. 5, 2015, 10 pgs.
U.S. Appl. No. 14/069,574, Response filed Apr. 6, 2015 to Restriction Requirement dated Feb. 5, 2015.
U.S. Appl. No. 14/069,574, Non Final Office Action dated Jul. 15, 2015, 15 pgs.
U.S. Appl. No. 14/069,574, Response filed Oct. 15, 2015 to Non Final Office Action dated Jul. 15, 2015, 7 pgs.
U.S. Appl. No. 14/069,574, Final Office Action dated Oct. 29, 2015, 16 pgs.
U.S. Appl. No. 14/069,574, Response filed Jan. 29, 2016 to Final Office Action dated Oct. 29, 2015, 9 pgs.
U.S. Appl. No. 14/069,574, Advisory Action dated Feb. 10, 2016, 4 pgs.
U.S. Appl. No. 14/069,574, Notice of Allowance dated Apr. 27, 2016, 9 pgs.
"Chinese Application Serial No. 201480063209.0, Office Action dated Mar. 2, 2018", w/ English Translation, 18 pgs.

(56) References Cited

OTHER PUBLICATIONS

"Japanese Application Serial No. 2016-526281, Office Action dated Sep. 26, 2017", With English Translation, 6 pgs.
"Japanese Application Serial No. 2016-526281, Response filed Dec. 25, 2017 to Office Action dated Sep. 26, 2017", w/ Amended claims, 18 pgs.
"Korean Application Serial No. 10-2016-7014682, Response filed Dec. 28, 2017 to Office Action dated Jul. 31, 2017", w/ Amended Claims, 25 pgs.
U.S. Appl. No. 15/255,967, Final Office Action dated Jan. 4, 2018, 20 pgs.
U.S. Appl. No. 15/255,967, Response filed Mar. 2, 2018 to Final Office Action dated Jan. 4, 2018, 8 pgs.
U.S. Appl. No. 15/255,967, Non-Final Office Action dated Mar. 28, 2018, 28 pgs.
U.S. Appl. No. 15/255,967, Examiner Interview Summary dated Apr. 17, 2018, 3 pgs.

* cited by examiner

US 10,090,317 B2

1

METHODS AND APPARATUSES HAVING MEMORY CELLS INCLUDING A MONOLITHIC SEMICONDUCTOR CHANNEL

PRIORITY APPLICATION

This application is a divisional of U.S. application Ser. No. 14/069,574, filed Nov. 1, 2013, which is incorporated herein by reference in its entirety.

TECHNICAL FIELD

The present embodiments relate generally to memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

Flash memory devices typically use a one-transistor memory cell that may allow for high memory densities, high reliability, and low power consumption. Changes in threshold voltage of the cells, through programming of a charge storage structure, such as floating gates, trapping layers or other physical phenomena, may determine the data state of each cell.

The memory cells may be arranged in strings of memory cells where each string may be coupled to a source. Groups of strings of memory cells (e.g., memory blocks) may all be coupled to a common source.

As the performance of computers and other electronics continues to improve, memory manufacturers may be under pressure to continue to increase the performance of memory devices. For example, reductions in memory string current and gate induced drain leakage (GIDL) might be desirable.

DETAILED DESCRIPTION

Figure 1:
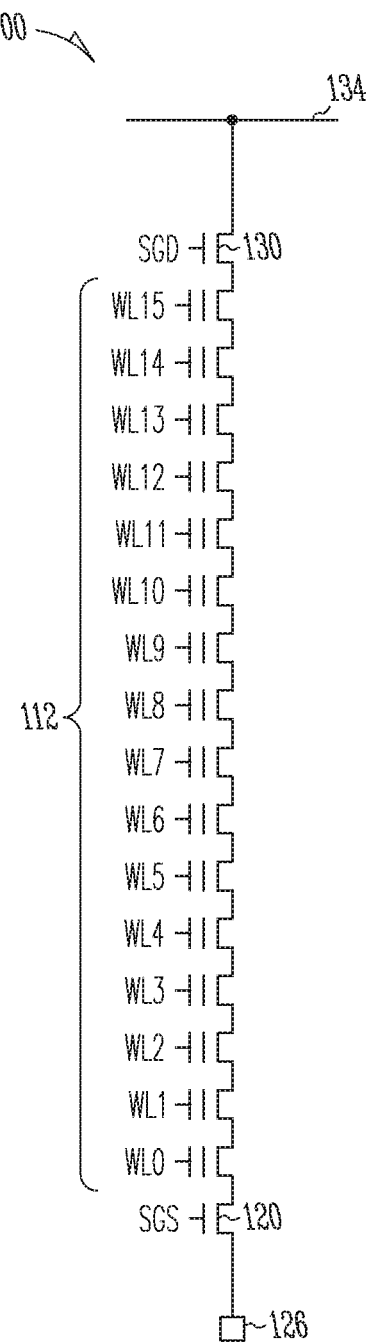
FIG. 1 illustrates a schematic diagram of an embodiment of a string of memory cells.

In the following detailed description, reference is made to the accompanying drawings that form a part hereof and in which are shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

2

FIG. 1 illustrates a schematic diagram of a string 100 of memory cells. For purposes of illustration only, the string 100 is shown having 16 memory cells 112. Alternate embodiments can include more or less than 16 memory cells 112. The string 100 can include a source select gate transistor 120 that may be an n-channel transistor coupled between one of the memory cells 112 at one end of the string 100 and a common source 126. The common source 126 may comprise, for example, a slot of commonly doped semiconductor material and/or other conductive material. At the other end of the string 100, a drain select gate transistor 130 may be an n-channel transistor coupled between one of the memory cells 112 and a data line (e.g., bit line) 134.

Each memory cell 112 may comprise, for example, a floating gate transistor or a charge trap transistor, and may be a single level charge storage device or a multilevel charge storage device. The memory cells 112, the source select gate transistor 120, and the drain select gate transistor 130 are controlled by signals on their respective control gates, with the signals being provided on access lines (e.g., word lines) WL0-WL15. In one embodiment, the control gates of memory cells in a row of memory cells can at least partially form an access lines.

The source select gate transistor 120 receives a control signal source select gate that controls the source select gate transistor 120 to substantially control conduction between the string 100 and the common source 126. The drain select gate transistor 130 receives a control signal that controls the drain select gate transistor 130, so that the drain select gate transistor 130 can be used to select or deselect the string 100.

The string 100 can be one of multiple strings of memory cells in a block of memory cells in a memory device, such as a NAND-architecture flash memory device. Each string of memory cells may be formed vertically in a three-dimensional fashion such that they extend outward from a substrate as opposed to in a planar manner (e.g., horizontally along the substrate).

Subsequently described FIGS. 2-11 illustrate embodiments of fabrication steps for forming vertical strings of memory cells having a monolithic thin semiconductor (e.g., polysilicon) channel and a metal source. Subsequently described FIGS. 12-16 illustrate embodiments of fabrication steps for forming vertical strings of memory cells having the monolithic thin semiconductor channel and a semiconductor source. Instead of completely filling a first opening (e.g., a trench or hole) with the semiconductor material that may act as a channel during operation, the described embodiments use a monolithic thin semiconductor channel material that may line the interior of the first opening and thus act as a monolithic thin semiconductor liner. Thus, the term "thin" may refer to the thickness of the semiconductor channel material being less than the entire width of the first opening, such that a second opening (which may be filled or unfilled) is formed by the semiconductor channel material.

Figure 2:
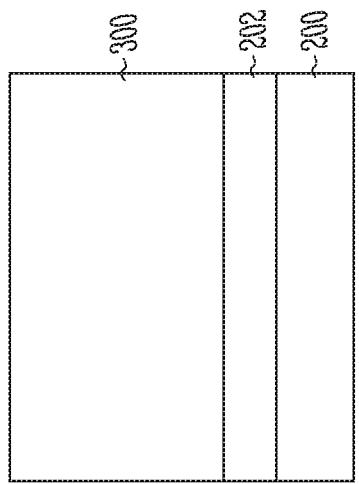
FIGS. 2-13 illustrate embodiments of fabrication steps for forming a vertical string of memory cells having a monolithic thin semiconductor channel and a metal source.

FIG. 2 illustrates embodiments of fabrication steps for forming a vertical string of memory cells. A metal material 200 (e.g., metal silicide) may be formed over a substrate 209 (e.g., silicon) to act as a metal source material. An oxide or polysilicon material 210 may be formed between the substrate 209 and the metal material 200.

The metal material 200 may be a pure metal or a metal silicide. In an embodiment, the metal may include one of: tungsten, tantalum, or molybdenum. In another embodiment, the metal silicide may include one of: tungsten silicide ($WSi_x$), tantalum silicide ($TaSi_x$), or molybdenum silicide (MoSi$_X$). A metal silicide may work better as a doped source metal since it may take doping better than a pure metal material.

A capping material 202 may be formed over the metal material 200. The capping material 202 may be an oxide material, a polysilicon material, or some other capping material for sealing pores in the metal material 200. If the capping material 200 is an oxide, the oxide may be used as a source select gate oxide for the source select gate transistor 120 as illustrated in FIG. 1.

The metal material 200 can be doped 204 in order to alter its electrical properties as desired. For example, arsenic or phosphorus may be used for doping 204 the metal material to create an n-type conductor. Boron or gallium may be used to dope 204 the metal material 200 to create a p-type conductor.

Figure 3:
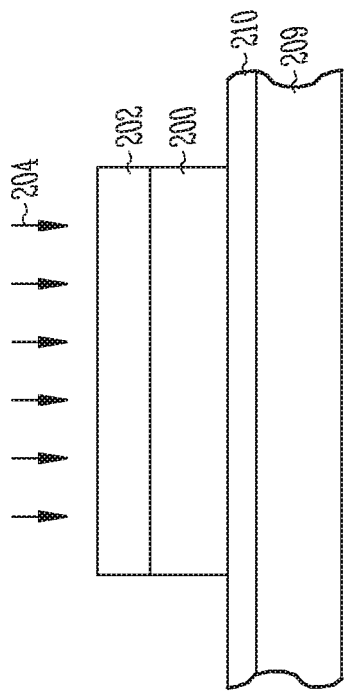

FIG. 3 illustrates an embodiment of another fabrication step for forming the vertical string of memory cells. A source select gate conductive material (e.g., conductively doped polysilicon) 300 may be formed over the capping material 202. In an embodiment, the source select gate conductive material 300 may be used as a source select gate. Thus, the capping material (e.g., source select gate oxide) 202 and the source select gate conductive material 300 together may be referred to as source select gate material.

Figure 4:
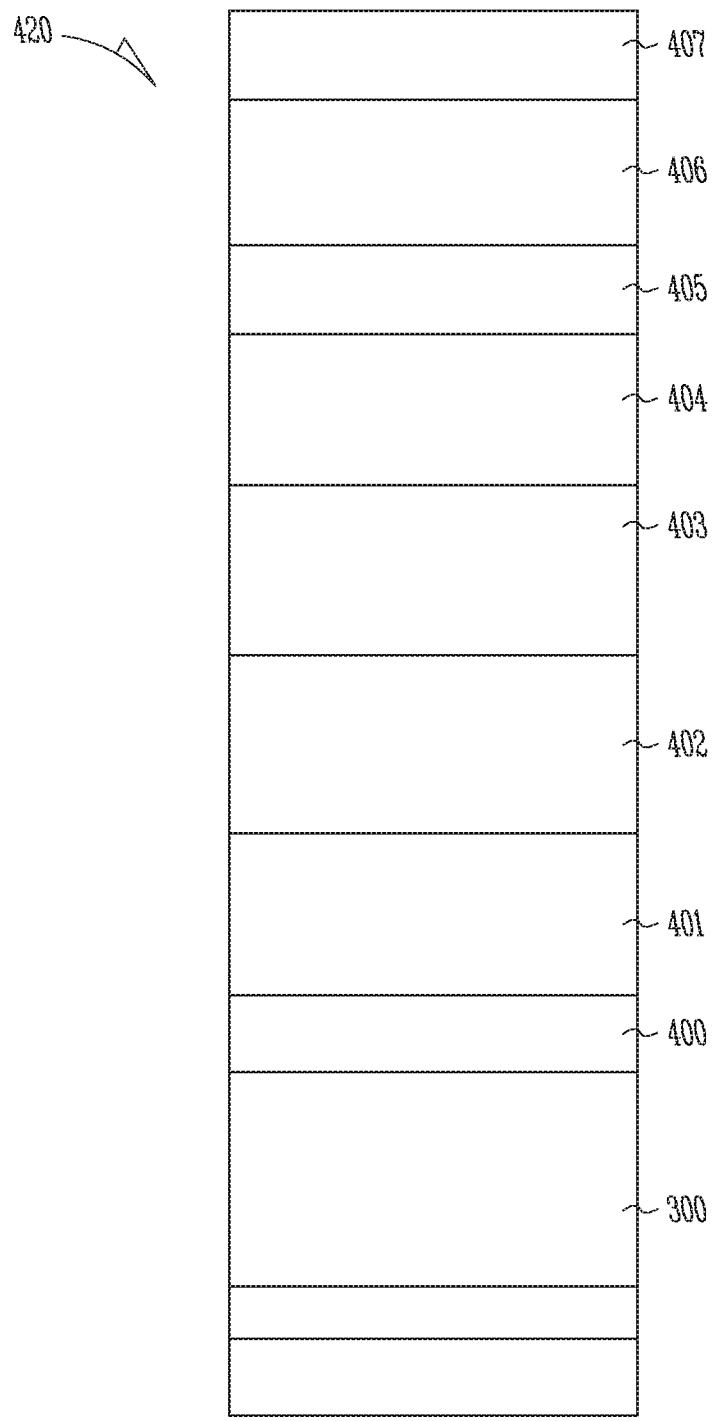

FIG. 4 illustrates an embodiment of a series of fabrication steps for forming the vertical string of memory cells. The fabrication steps comprise forming a stack of materials 420 to be etched later.

An etch stop material 400 may be formed over the source select gate conductive material 300. In an embodiment, the etch stop material 400 may be a metal oxide such as aluminum oxide (Al$_2$O$_3$).

A stack of alternating levels of control gate material 401, 403 and insulator material 402, 404 may be formed over the etch stop material 400. For example, the control gate material 401, 403 may be a conductive material (e.g., polysilicon) and the insulator material 402, 404 may be an oxide material. The control gate material 401, 403 may be used as the control gates of the vertically formed memory cells while the insulator material 402, 404 may be used between the memory cells to isolate adjacent memory cells from each other.

The stack of materials 420 may further comprise a drain select gate insulator material 405 (e.g., oxide) and a drain select gate conductive material (e.g., conductively doped polysilicon) 406 formed over the insulating material 404 of the alternating insulator materials 402, 404. In an embodiment, the drain select gate insulator material 405 may be a drain select gate oxide and the drain select gate conductive material 406 may be a drain select gate polysilicon. Thus, a combination of the drain select gate insulator material 405 and the drain select gate semiconductor material 406 may both be referred to as drain select gate material.

A drain select gate nitride material 407 may be formed over the drain select gate semiconductor material 406. In an embodiment, the drain select gate nitride material 407 may be a nitride hard mask.

Figure 5:
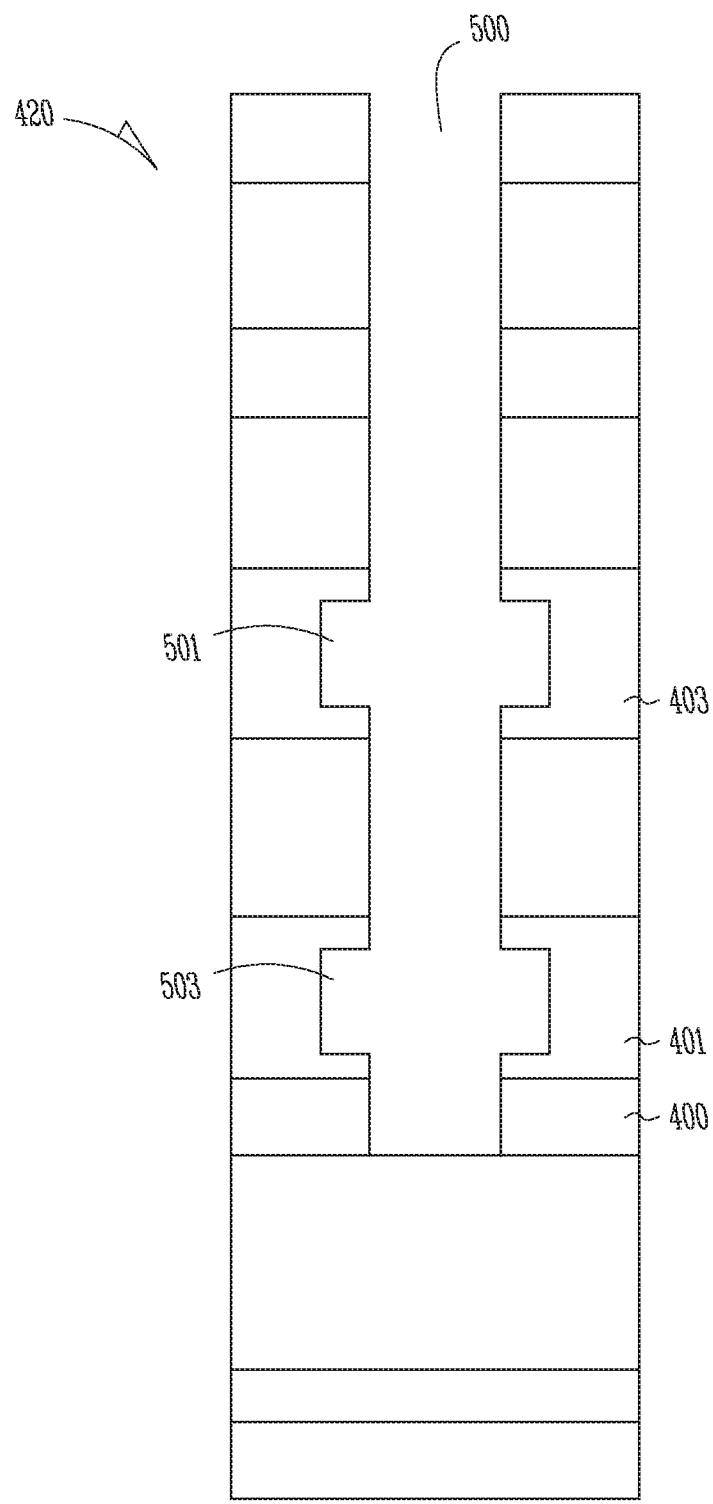

FIG. 5 illustrates an embodiment of a series of fabrication steps for forming the vertical string of memory cells. An etching step may be used to form an opening 500 in the vertical stack 420 down through the etch stop material 400. A directional etch process may be used to form recesses 501, 503 into the control gate material 403, 401 on the opening wall.

Figure 6:
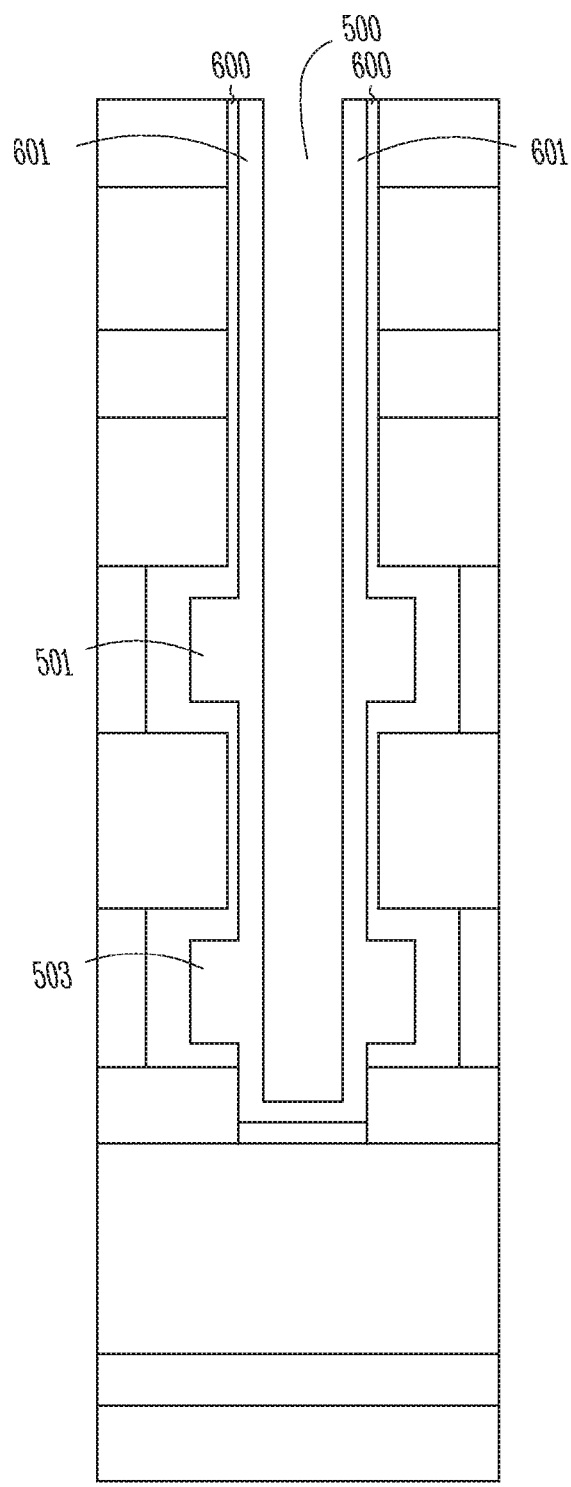

FIG. 6 illustrates an embodiment of a series of fabrication steps for forming the vertical string of memory cells. A dielectric material (e.g., oxide-nitride-oxide (ONO)) 600 may be formed along the interior wall of the opening 500. The ONO material 600 may also line the walls of the recesses 501, 503. In an embodiment, the ONO material 600 may be used as a dielectric material (e.g., oxide, charge blocking) for the string of memory cells.

A charge storage material, such as a polysilicon material 601, may be formed (e.g., deposited) over the ONO material 600 along the sidewall of the opening 500. The polysilicon material 601 may also at least partially fill (e.g., in some cases completely filling) the recesses 501, 503. In an embodiment, the polysilicon material 601 may be used as the floating gates for each memory cell in the string of memory cells.

Figure 7:
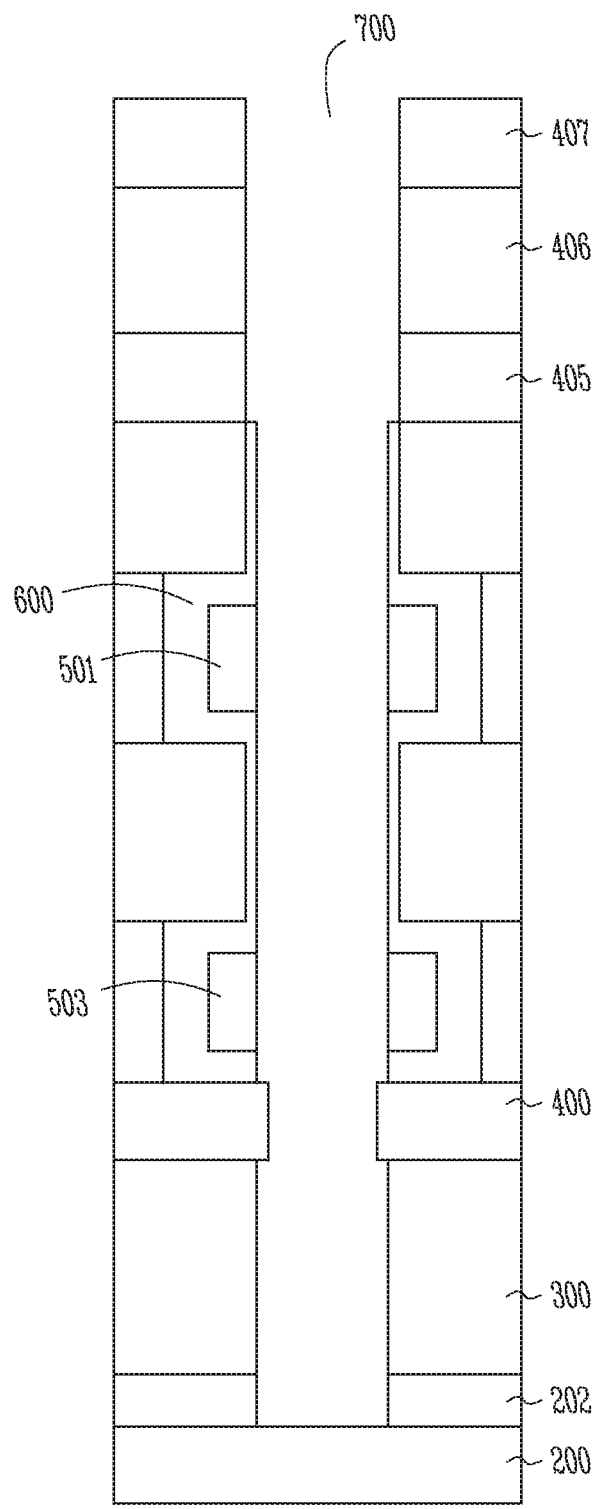

FIG. 7 illustrates an embodiment of a series of fabrication steps for forming the vertical string of memory cells. A post polysilicon etch process may be used to remove polysilicon 601 (e.g., excess polysilicon) along the sidewall of the previously formed opening and to form another opening 700 through the previously formed materials 202, 300, 400. The ONO material 600 along the sidewall of the drain select gate material 405, 406 and the drain select gate nitride material 407 may be removed.

The opening 700 may be formed down to the metal material 200. The polysilicon material 601 lining the sidewall of the opening 700 may be removed leaving the polysilicon material 601 that fills the recesses 501, 503 to act as the floating gates (e.g., floating gate material) of the memory cells. Since etching through so much material 202, 300, 400 may use a powerful etching process, the metal material 200 may act as a better etch stop material than a polysilicon material.

Figure 8:
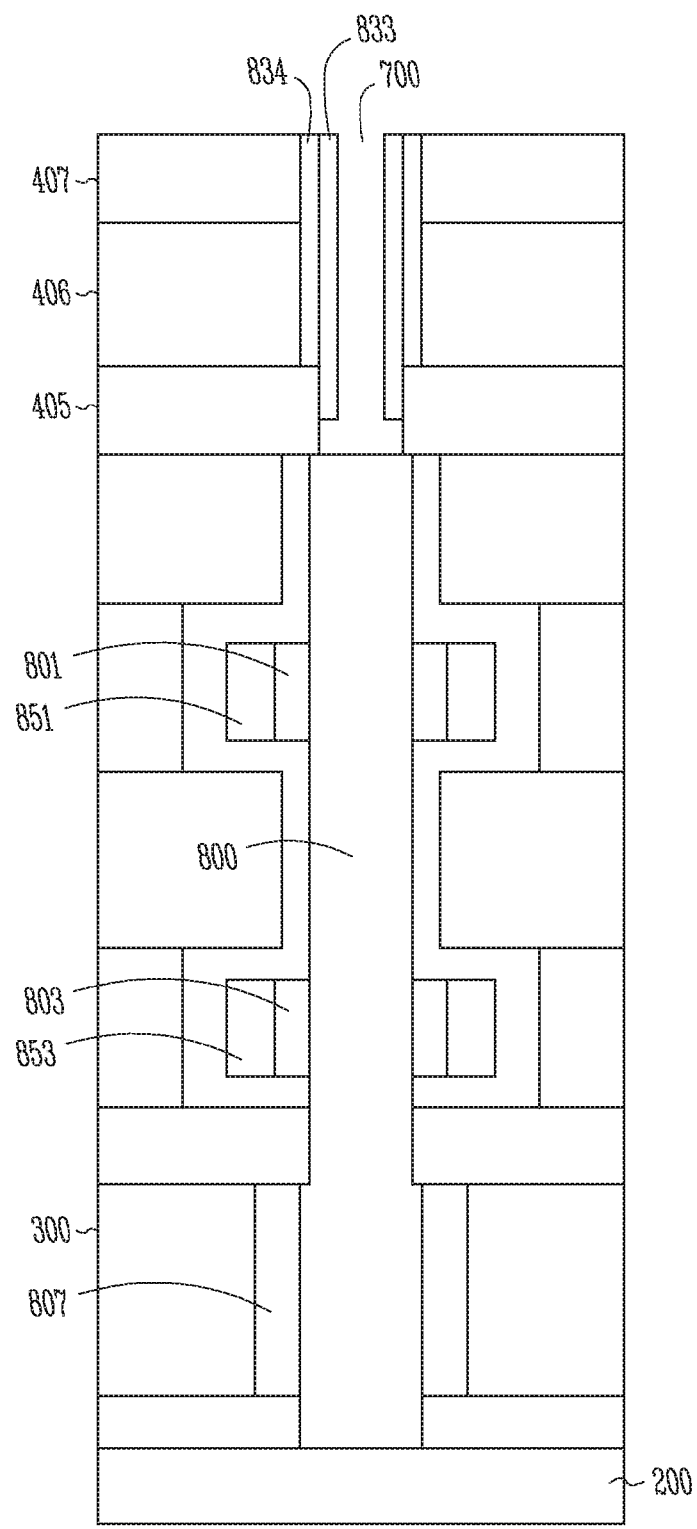
Figure 9:
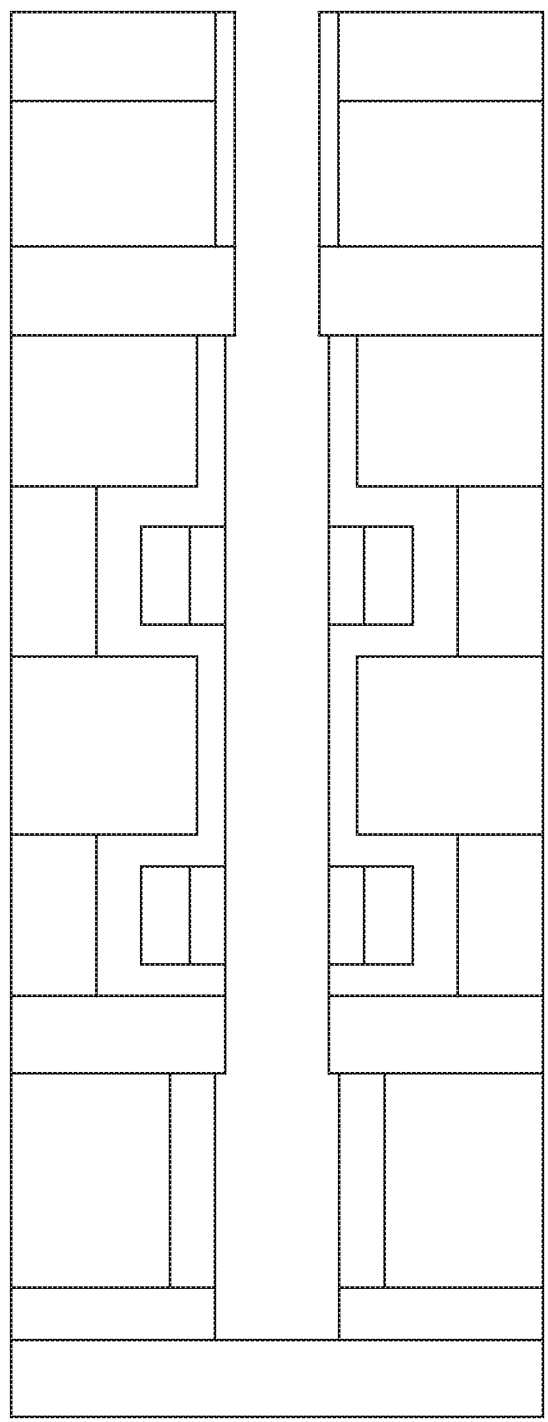

FIG. 8 illustrates forming a gate insulator material 834, 807 (e.g., oxide) over the drain select gate material 406, the drain select gate nitride material 407, and the source select gate conductive material 300, in the opening 700. A sacrificial poly channel pillar 800 can be formed in the opening 700. Additionally, a sacrificial poly layer 833 can be formed over the oxide 834 to protect it during later etch processes. A tetramethylammonium hydroxide (TMAH) poly wet etch process can be used to remove the pillar 800 and the select gate source and drain poly 833 selectively to the gate oxide 834, 807. The wet etch process can stop on the metal material 200 as shown in FIG. 9. An insulator material (e.g., oxide) 801, 803 may be formed (e.g., grown) on other particular areas of the opening 700. For example, an oxide 801, 803 may be formed over each floating gate material 851, 853 in each recess 501, 503. In an embodiment, this oxide 801, 803 may act as a tunnel dielectric between the floating gate material 851, 853 and a thin channel material to be formed subsequently in the opening 700.

Figure 10:
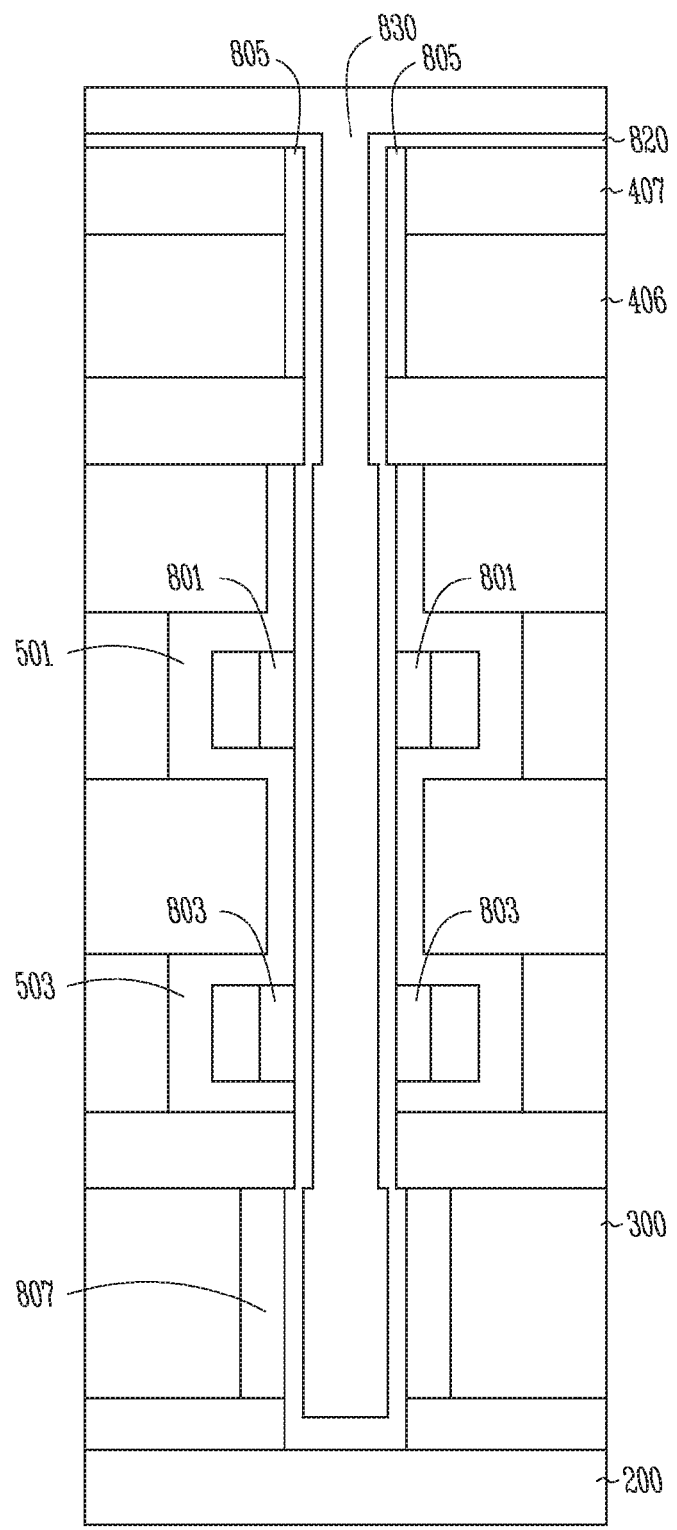

FIG. 10 illustrates that a monolithic semiconductor liner (e.g., polysilicon) 820 may be formed along the sidewall and bottom of the opening 700. The monolithic semiconductor liner 820 may be formed over the previously formed insulator materials (e.g., oxides) 801-808 and the top layer of the drain select gate nitride material 407. In an embodiment, the monolithic semiconductor liner 820 may be used as a thin channel material and operate as a channel during memory device operation. The monolithic semiconductor liner 820 may be in ohmic contact with the source material 200 and form still another opening.

The opening formed by the monolithic semiconductor liner 820 may be at least partially filled (e.g., completely filled) with an insulator material (e.g., oxide) 830. The insulator material 830 may also be formed over the monolithic semiconductor liner 820 on the top of the stack of materials. In another embodiment, the opening formed by the monolithic semiconductor liner 820 may be left hollow. This may result in subsequent fabrication steps being adjusted to compensate for the lack of support in the interior of the opening that was provided by the insulator material 830.

Figure 11:
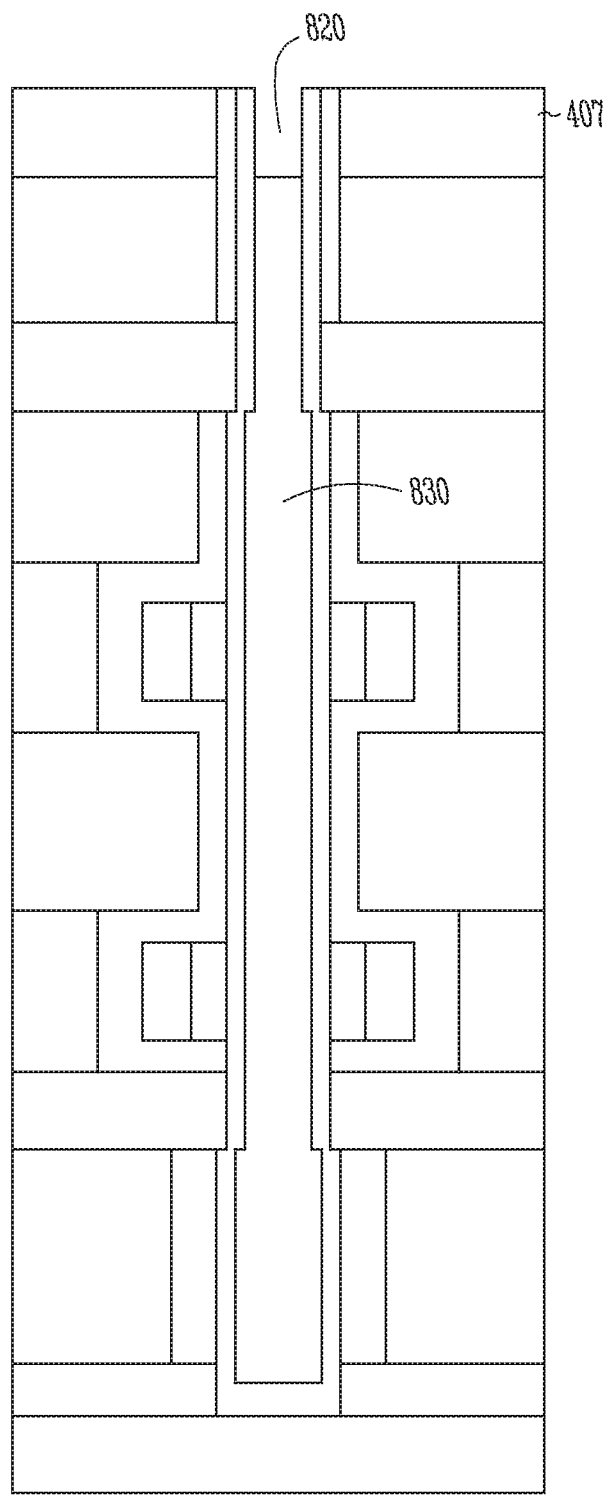

FIG. 11 illustrates that the insulator material 830 and semiconductor liner 820 that were formed on top of the stack may be removed, and a recess formed in the insulator material 830 formed inside the opening formed by the semiconductor liner 820. For example, an oxide and polysilicon chemical-mechanical planarization (CMP) process might be used to remove these materials and form the recess in the insulator material 830 within the opening formed by the semiconductor liner 820.

Figure 12:
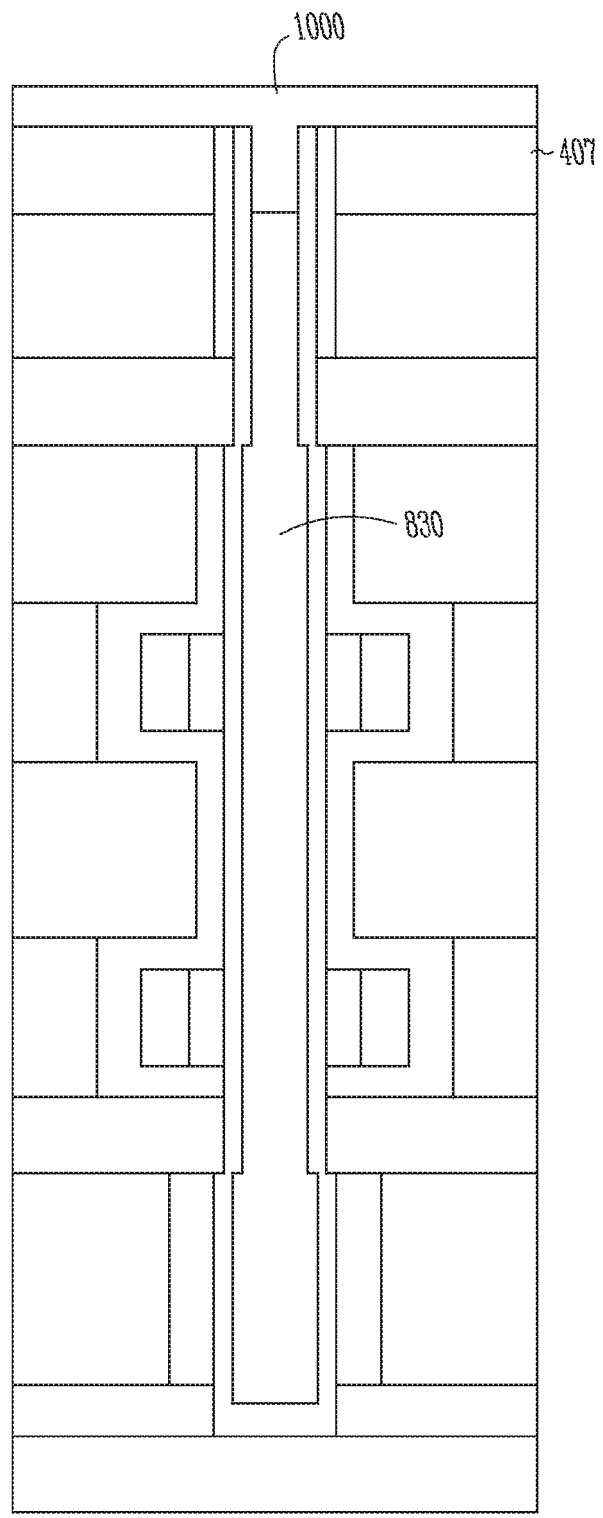

FIG. 12 illustrates that a conductive material (e.g., conductively doped polysilicon) 1000 may be formed on the drain select gate nitride material 407 and at least partially into the recess formed into the insulator material 830 to fill the recess in the insulator material 830.

Figure 13:
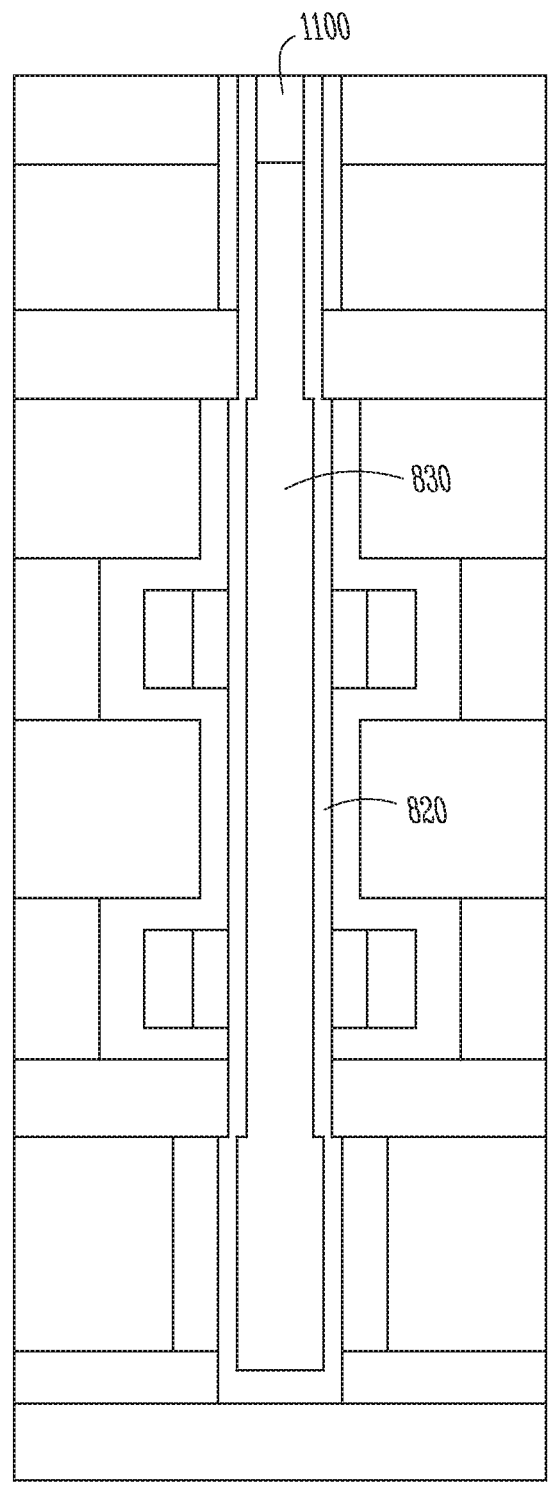

FIG. 13 illustrates that the top portion of the conductive material 1000 may be removed from the top of the stack of materials, leaving a conductive plug 1100 in the recess. The plug 1100 may be in contact with the monolithic semiconductor liner 820 to provide additional continuity between the end of the channel as well as provide a larger surface area on which to form subsequent materials (e.g., bit line material).

FIGS. 14-18 illustrate an embodiment of fabrication steps for forming the vertical string of memory cells having the monolithic thin semiconductor channel and a semiconductor source instead of a metal source (e.g., instead of metal source material 200 in FIG. 2). Since the source may be a semiconductor source material (e.g., polysilicon) instead of metal, additional steps may be used to protect the semiconductor material during some of the etching processes. The semiconductor source material may be doped as previously described in relation to the doping of the metal source material embodiment of FIG. 2.

In the interest of brevity, most of the common steps with the embodiments of FIGS. 2-13 have already been performed. However, instead of the step of forming the metal source material 200, the subsequent embodiments form a semiconductor (e.g., polysilicon) source material 1200.

Figure 14:
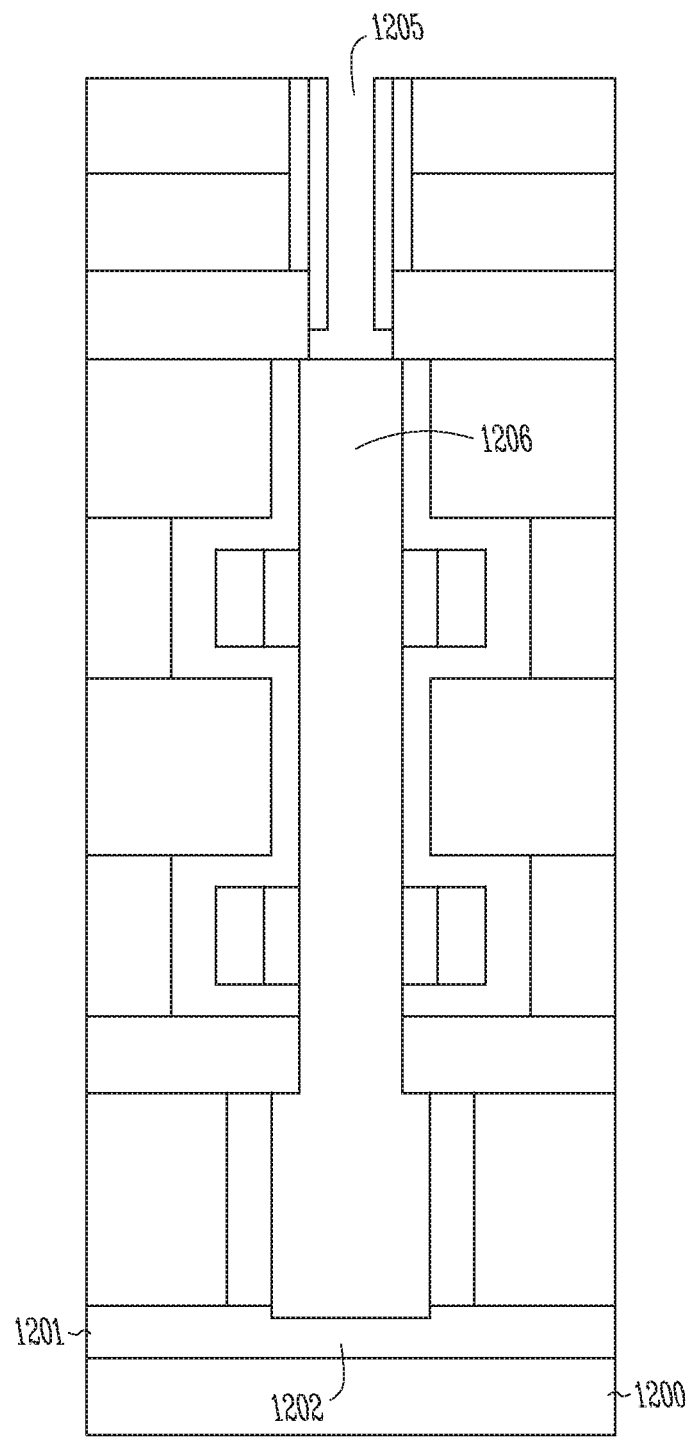
FIGS. 14-18 illustrate embodiments of fabrication steps for forming a vertical string of memory cells having a monolithic thin semiconductor channel and a semiconductor source.

FIG. 14 shows the semiconductor source material 1200 with an overlying insulator material (e.g., oxide) 1201. A thinner portion 1202 of the insulator material 1201 is under the opening 1205 that is filled with a semiconductor pillar 1206.

Figure 15:
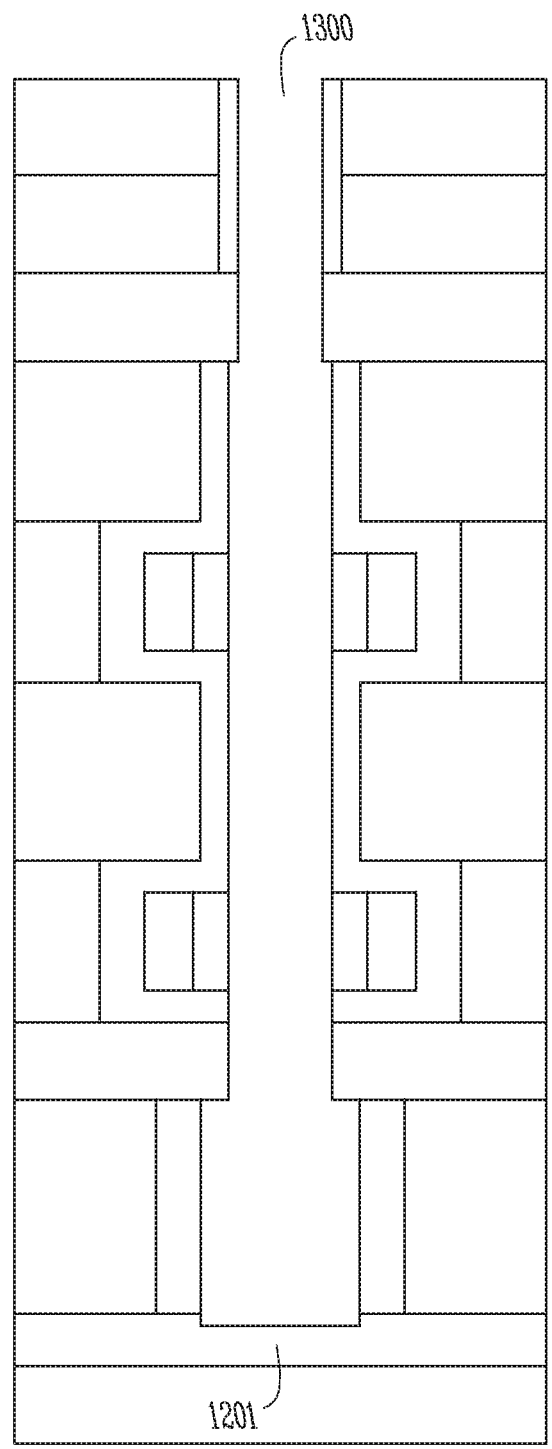

FIG. 15 illustrates an embodiment of another fabrication step for forming the vertical string of memory cells. The semiconductor pillar 1206 may be removed from the opening such that only the thin insulator material 1201 remains. In an embodiment, a TMAH poly wet etch process may be used for such a step.

Figure 16:
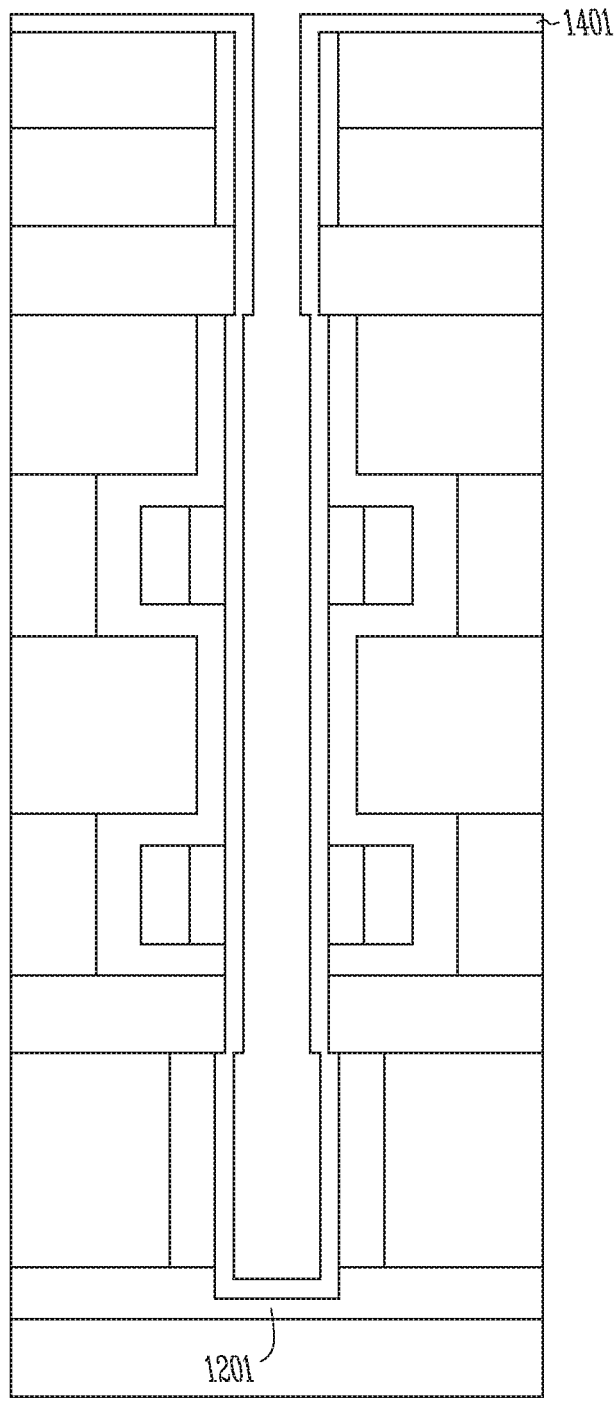

FIG. 16 illustrates an embodiment of another fabrication step for forming the vertical string of memory cells. A semiconductor (e.g., polysilicon) liner 1401 may be formed in the opening. The semiconductor liner 1401 may be formed over the thinner portion 1202 of the insulator material 1201 at the bottom of the opening. In an embodiment, the semiconductor liner 1401 may be the thin channel material and used as the channel region of the string of memory cells during operation.

Figure 17:
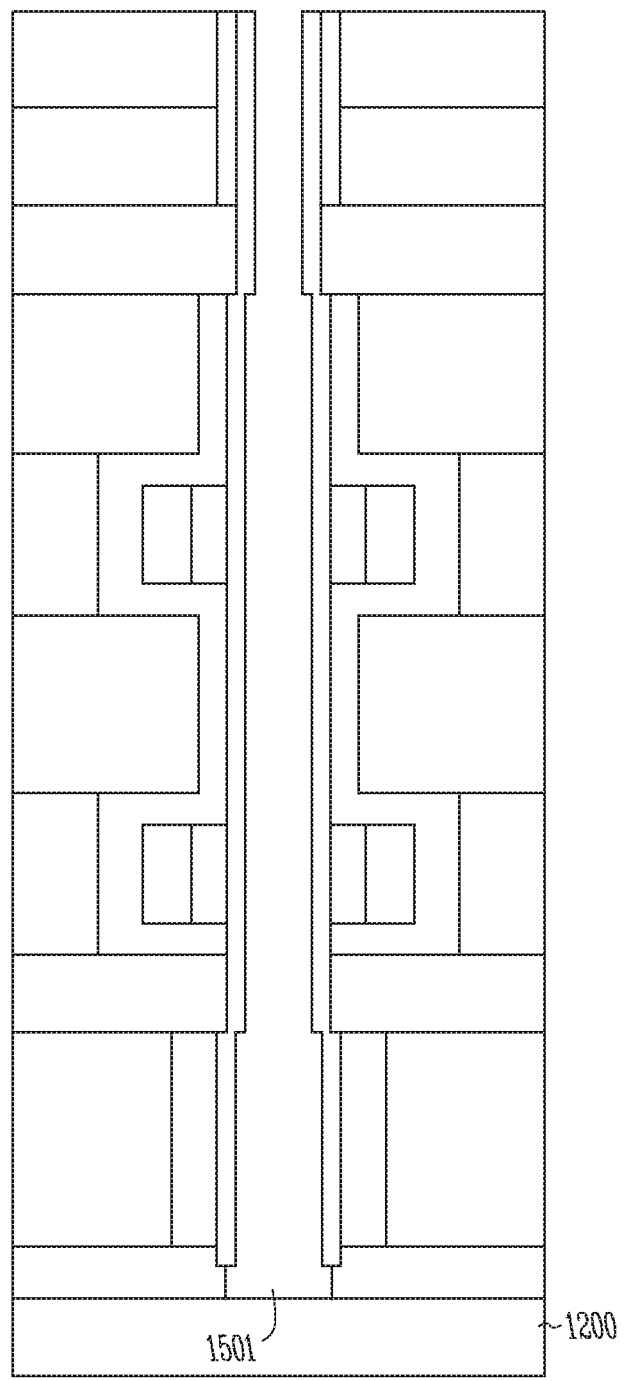

FIG. 17 illustrates that the thinner portion 1202 of the insulator material 1201 may be removed from the bottom of the opening 1501 leaving the semiconductor source material 1200 exposed to the hollow opening. In an embodiment, this may be accomplished by an etch process (e.g., post punch etch).

Figure 18:
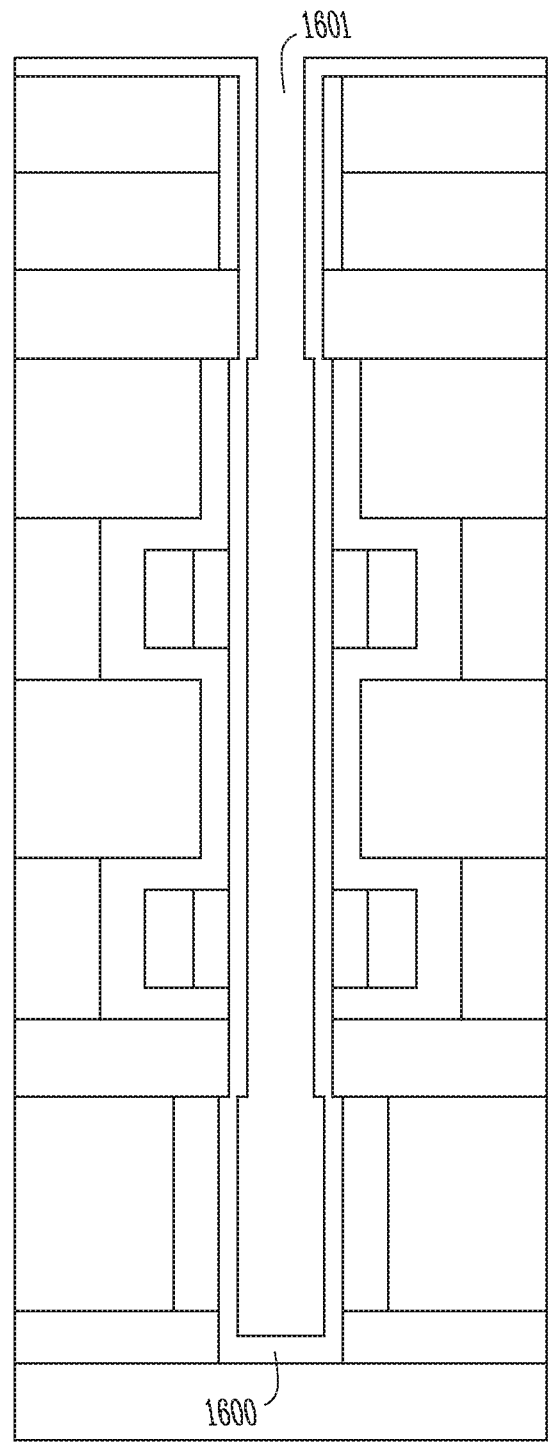

FIG. 18 illustrates that a semiconductor material 1600 is formed on the bottom of the opening such that a combination of semiconductor material 1600 and semiconductor liner 1401 forms a monolithic thin semiconductor (e.g., polysilicon) channel material along the opening walls and bottom. An insulator material (e.g., oxide) 1601 may be used to at least partially fill the hollow opening. As in previous embodiments, the insulator material 1601 may be left out in order to leave this opening hollow.

Subsequent process steps are not shown but are substantially similar to steps shown in FIGS. 11-13 wherein a plug is eventually formed to connect the thin semiconductor channel material The plug may also be used to provide an additional surface area on which subsequent processing steps may form additional materials (e.g., bit lines).

Figure 19:
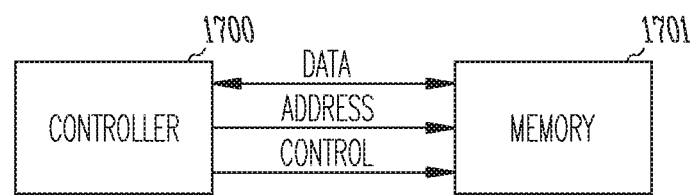
FIG. 19 illustrates a block diagram of an embodiment of a system.

FIG. 19 illustrates an embodiment of a system that may use the vertically formed string of memory cells of FIGS. 1-18. A controller 1700 may be used to control operations of the system. A memory device 1701, coupled to the controller 1700, may include a memory array comprising a plurality of vertically formed strings of memory cells described above with reference to FIGS. 1-16. In an embodiment, the controller 1700 may be coupled to the memory device 1701 over control, data, and address buses. In another embodiment, the address and data buses may share a common input/output (I/O) bus.

An apparatus may be defined as circuitry, an integrated circuit die, a device, or a system.

CONCLUSION

One or more embodiments can provide a monolithic thin semiconductor channel in a three dimensional memory device (e.g., NAND flash). The monolithic thin semiconductor channel material may be formed within a first opening. The thin semiconductor channel material may be formed such that the channel material forms an ohmic contact with a source. A second opening, formed by the monolithic thin semiconductor channel material, may be filled with an insulator material or left hollow. The top of the monolithic thin semiconductor channel material may be connected with a conductive plug.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A method for forming a string of memory cells, the method comprising:
    forming a source;
    forming a source select gate material over the source;
    forming multiple levels of control gate material alternating with multiple insulator levels, the multiple levels of control gate material and multiple insulator levels extending over the source select gate material and over the source;
    forming respective charge storage structures in the multiple levels of control gate material, forming a first opening through the multiple alternating levels of control gate material and insulator levels, the first opening extending adjacent multiple charge storage structures;

forming a semiconductor pillar within the first opening, the semiconductor pillar extending adjacent the multiple charge storage structures adjacent the first opening;

removing the semiconductor pillar to expose a sidewall defining the first opening; and forming a vertical semiconductor material along a sidewall of the opening, the vertical semiconductor material coupled to the source, wherein the charge storage structures are separated from the vertical semiconductor material by at least a dielectric material, the vertical semiconductor material having a thickness that is less than a width of the first opening such that a second opening is formed by the vertical semiconductor material.

2. The method of claim 1 further comprising:
forming a capping material over the source; and
forming the select gate material over the capping material.

3. The method of claim 1 wherein the source comprises one of a metal or a polysilicon.

4. The method of claim 3 wherein the metal is a metal silicide.

5. The method of claim 4 wherein the metal silicide is one of: tungsten silicide ($WSi_x$), tantalum silicide ($TaSi_x$), or molybdenum silicide ($MoSi_x$).

6. The method of claim 3, wherein the source comprises polysilicon, and further comprising doping the source.

7. The method of claim 6 wherein doping the source comprises one of: doping the source with arsenic or phosphorus to create an n-type conductor or doping the metal silicide source with boron or gallium to create a p-type conductor.

8. The method of claim 1 further comprising at least partially filling the second opening formed by the vertical semiconductor material with an oxide material.

9. The method of claim 1 further comprising forming a conductive plug in a top of the second opening formed by the vertical semiconductor material such that the vertical semiconductor material is coupled to the plug.

10. The method of claim 1 further comprising:
forming a drain select gate insulator material over the multiple alternating levels of control gate and insulator materials; and
forming a drain select gate conductive material over the drain select gate insulator material;
wherein the first opening is formed through and adjacent to the drain select gate insulator material and the drain select gate conductive material, and
wherein the vertical semiconductor material is separated from the drain select gate insulator material and the drain select gate conductive material by at least the dielectric material.

11. A method for forming a string of memory cells, the method comprising:
forming respective charge storage structures in multiple levels of control gate material, the multiple levels of control gate material alternating with multiple levels of insulator material above a source and a source select gate material;
forming a first opening through the multiple alternating levels of control gate and insulator materials, the first opening extending adjacent multiple charge storage structures;

forming a semiconductor pillar within the first opening, the semiconductor pillar extending adjacent the multiple charge storage structures adjacent the first opening;

removing the semiconductor pillar to expose a sidewall defining the first opening; and forming a monolithic semiconductor liner along a sidewall of the first opening, the monolithic semiconductor liner having an ohmic connection to the source and being adjacent to the charge storage structures wherein the multiple charge storage structures are separated from the monolithic semiconductor liner by a tunnel dielectric, the monolithic semiconductor liner defining a second opening within the liner;

forming an insulator material within the second opening; and forming a conductive plug over the insulator material such that the plug connects to a top portion of the monolithic semiconductor liner.

12. The method of claim 11 wherein the source is formed in a material level extending over the substrate; and further comprising:
doping the source material;
forming a capping material over the source material;
forming the source select gate material over the capping material;
and
forming a drain select gate material over the multiple alternating levels of control gate and insulator material.

13. The method of claim 12 further comprising forming a polysilicon material between the substrate and the source material.

14. The method of claim 12 wherein forming the source select gate material comprises:
forming a source select gate oxide over the doped source material; and
forming a source select gate conductive material over the source select gate oxide.

15. The method of claim 12 wherein forming the drain select gate material comprises:
forming a drain select gate oxide over a top material of the multiple alternating levels of control gate and insulator materials; and
forming a drain select gate conductive material over the drain select gate oxide.

16. The method of claim 11 wherein the monolithic semiconductor liner comprises a polysilicon material.

17. A method for forming a string of memory cells, the method comprising:
forming a source material over a substrate, including forming an oxide material between the substrate and the source material;
doping the source material;
forming a capping material over the source material;
forming a source select gate material over the capping material;
forming respective charge storage structures in multiple levels of control gate material, the multiple levels of control gate material alternating with multiple levels of insulator material, the multiple alternating levels of control gate and insulator materials formed over the source select gate material;
forming a drain select gate material over the multiple alternating levels of control gate and insulator material;
forming a first opening through the multiple alternating levels of control gate and insulator materials;

forming a monolithic semiconductor liner along a sidewall of the first opening, the monolithic semiconductor liner having an ohmic connection to a source material and being adjacent to the charge storage structures wherein the multiple charge storage structures are separated from the monolithic semiconductor liner by a tunnel dielectric, the monolithic semiconductor liner having a thickness that is less than a width of the first opening such that a second opening is formed by the liner;

forming an insulator material within the second opening formed by the monolithic semiconductor liner; and forming a conductive plug over the insulator material such that the plug connects to a top portion of the monolithic semiconductor liner.

18. A method for forming a string of memory cells, the method comprising:

forming respective charge storage structures in multiple levels of control gate material, the multiple levels of control gate material alternating with multiple levels of insulator material;

forming a first opening through the multiple alternating levels of control gate and insulator materials;

forming a monolithic semiconductor liner along a sidewall of the first opening, the monolithic semiconductor liner having an ohmic connection to a source material and being adjacent to the charge storage structures wherein the multiple charge storage structures are separated from the monolithic semiconductor liner by a tunnel dielectric, the monolithic semiconductor liner having a thickness that is less than a width of the first opening such that a second opening is formed by the liner;

forming an insulator material within the second opening formed by the monolithic semiconductor liner, wherein forming the insulator material comprises, forming an oxide within the second opening and over the drain select gate material;

removing the oxide formed over the drain select gate material, and forming a recess in the oxide within the second opening;

forming a conductive plug over the insulator material such that the plug connects to a top portion of the monolithic semiconductor liner.

19. The method of claim 18 wherein forming the conductive plug comprises:

forming a polysilicon material within the recess and over the drain select gate material; and removing the polysilicon material formed over the drain select gate material while leaving the polysilicon material formed in the recess.

* * * * *